(12) United States Patent
Ono

(10) Patent No.: US 6,518,075 B2
(45) Date of Patent: Feb. 11, 2003

(54) METHOD OF FORMING S/D EXTENSION REGIONS AND POCKET REGIONS BASED ON FORMULATED RELATIONSHIP BETWEEN DESIGN AND MEASURED VALUES OF GATE LENGTH

(75) Inventor: Atsuki Ono, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/835,517

(22) Filed: Apr. 17, 2001

(65) Prior Publication Data

US 2001/0041377 A1 Nov. 15, 2001

(30) Foreign Application Priority Data

Apr. 18, 2000 (JP) ........................................ 2000-116631

(51) Int. Cl.⁷ ........................... H01L 21/66; G01R 31/26
(52) U.S. Cl. ........................ 438/14; 438/301; 438/303; 438/289; 438/514
(58) Field of Search ................................ 438/230, 301, 438/303, 289, 14, 514; 257/339, 344

(56) References Cited

U.S. PATENT DOCUMENTS 5,239,201 A * 8/1993 Asano .......................... 257/758
5,822,241 A * 10/1998 Chatterjee et al. ........... 365/149
5,863,824 A * 1/1999 Gardner et al. .............. 438/303
5,981,346 A * 11/1999 Hopper ........................ 438/304
6,228,663 B1 * 5/2001 Gardner et al. ................ 438/14
6,239,467 B1 * 5/2001 Gardner et al. .............. 257/344

FOREIGN PATENT DOCUMENTS

| JP | 58-197878 | 11/1983 |
| JP | 58-206161 | 12/1983 |
| JP | 60-98678  | 6/1985  |
| JP | 1-42497   | 9/1989  |
| JP | 2-7178    | 2/1990  |

* cited by examiner

Primary Examiner—Carl Whitehead, Jr.
Assistant Examiner—Khanh B. Duong
(74) Attorney, Agent, or Firm—McGinn & Gibb, PLLC

(57) ABSTRACT

The relationship between the difference between design and measured values of the gate length of a gate electrode of a transistor and the dose of an impurity to be injected into SD extension regions or pocket regions which is necessary to equalize characteristics of the transistor to design values is formulated. The gate length of the gate electrode which is produced by photolithography and etching process is measured. The dose of the impurity to be injected into the SD extension regions or the pocket regions is adjusted to bring deviations of the characteristics of the transistor from the design values into a predetermined range, based on the measured value of the gate length and the formulated relationship.

20 Claims, 15 Drawing Sheets

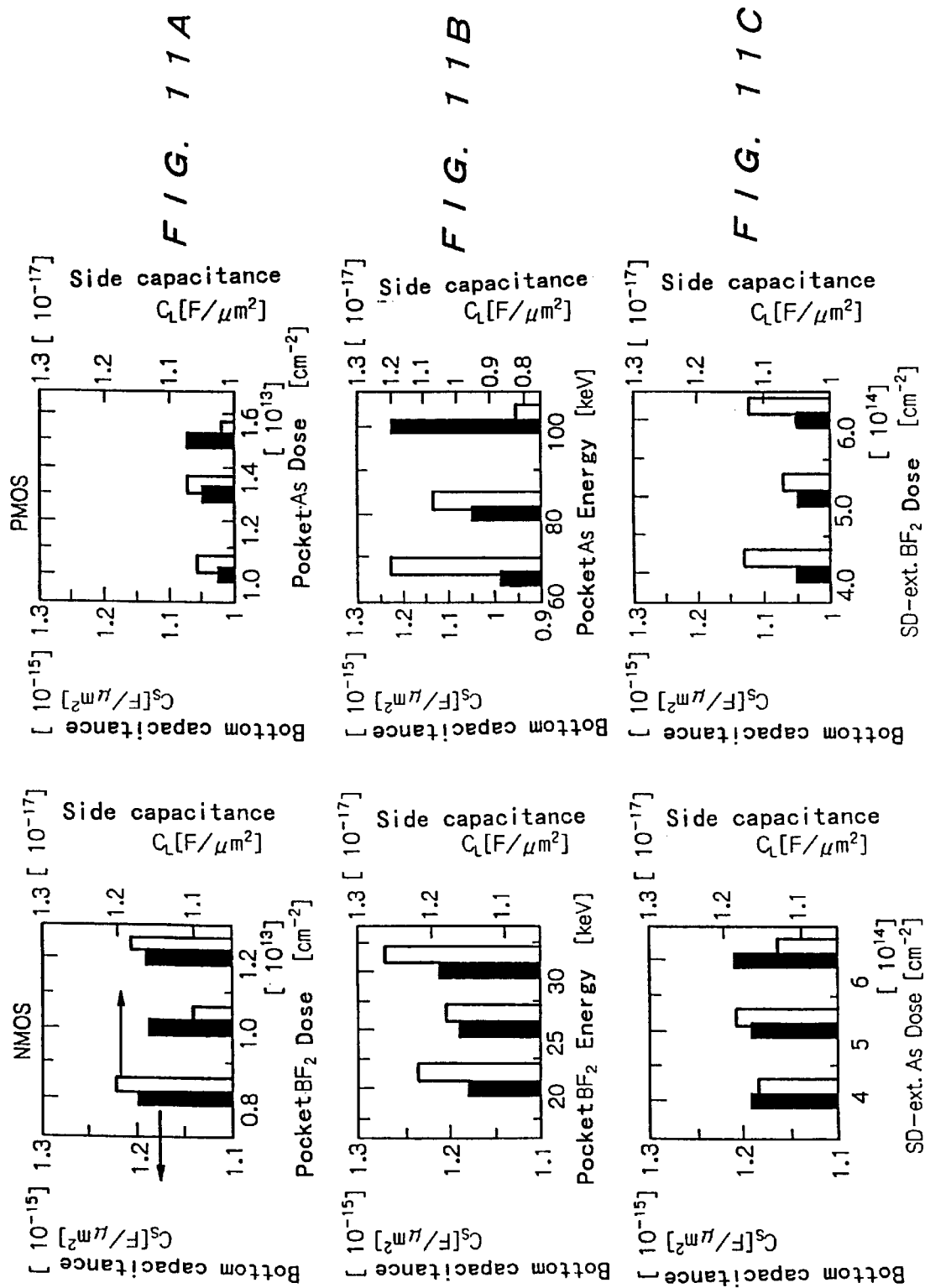

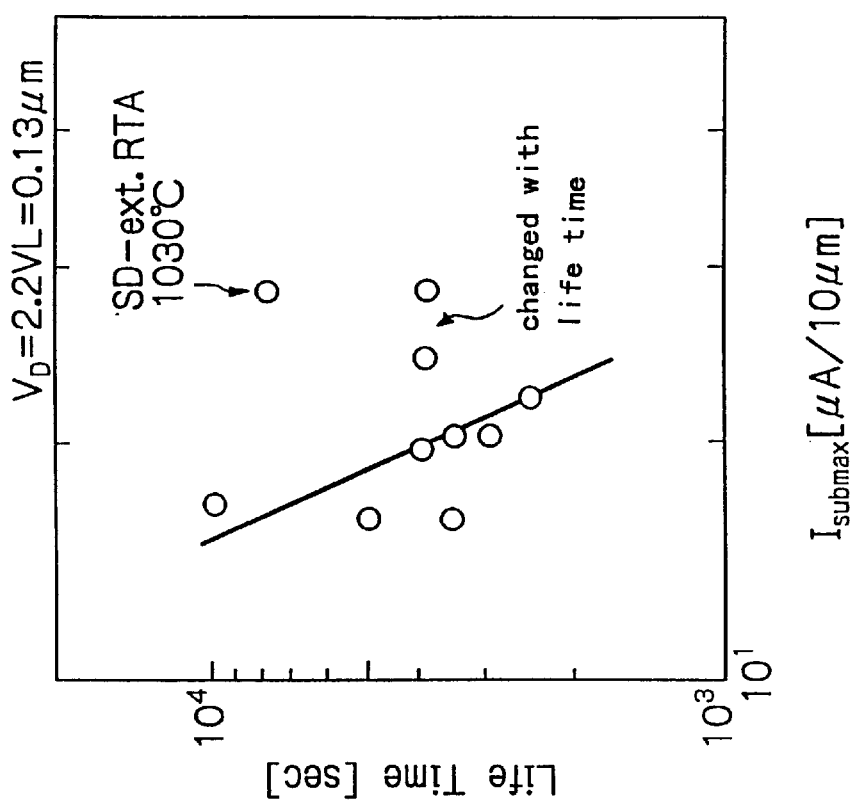
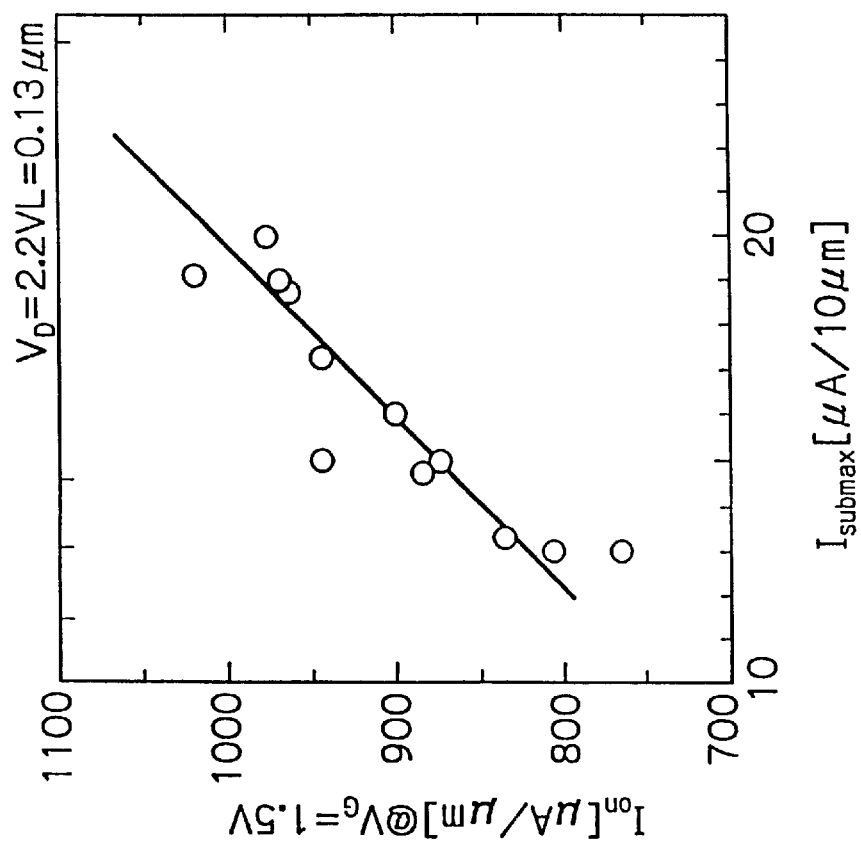

| | | |
|---|---|---|
| ● | SD-ext. BF2 | 2.5KeV/5E14[cm$^{-2}$] |
| | Pocket As | 85KeV/1.3E13[cm$^{-2}$] |
| ▽ | SD-ext. BF2 | 2.5KeV/4E14[cm$^{-2}$] |
| | Pocket As | 85KeV/1.3E13[cm$^{-2}$] |
| △ | SD-ext. BF2 | 2.5KeV/6E14[cm$^{-2}$] |
| | Pocket As | 85KeV/1.3E13[cm$^{-2}$] |
| ▼ | SD-ext. BF2 | 2.5KeV/4E14[cm$^{-2}$] |
| | Pocket As | 100KeV/1.3E13[cm$^{-2}$] |
| ▲ | SD-ext. BF2 | 2.5KeV/6E14[cm$^{-2}$] |
| | Pocket As | 65KeV/1.3E13[cm$^{-2}$] |
| + | SD-ext. BF2 | 2.5KeV/5E14[cm$^{-2}$] |
| | Pocket As | 85KeV/1.5E13[cm$^{-2}$] |
| ◇ | SD-ext. BF2 | 2.5KeV/5E14[cm$^{-2}$] |
| | Pocket As | 100KeV/1.3E13[cm$^{-2}$] |

FIG. 14

|  | Transistor characteristic | | Circuit performance | Reliability | |
|---|---|---|---|---|---|
|  | nMOS | pMOS |  | HC(hot carrier) life time | NBTI life time |
| SD-ext. (dose) | NP | NP | NP | NP | NP |
| Pocket (dose) | NP | NP | NP | NP | NP |
| Pocket (energy) | NP | NP | degraded in low energy | changed in low energy | NP |
| SD-ext. RTA | NP | X | X | changed in high temperature X | |

NP: No problem

METHOD OF FORMING S/D EXTENSION REGIONS AND POCKET REGIONS BASED ON FORMULATED RELATIONSHIP BETWEEN DESIGN AND MEASURED VALUES OF GATE LENGTH

BACKGROUND OF THE INVENTION

1. Field of the Invention

The present invention relates to a method of manufacturing a semiconductor device having a transistor with SD extension regions and pocket regions, and more particularly to a method of manufacturing a semiconductor device having a transistor whose gate length is 0.18 µm or less.

2. Description of the Related Art

Next-generation transistors whose gate length is 0.18 µm or less are of a structure having SD extension regions and pocket regions, as shown in FIG. 1 of the accompanying drawings, for example, in order to increase an ON current for high-speed transistor operation and prevent a threshold voltage $V_{TH}$ from being lowered due to a known short channel effect.

The structure of an n-channel MOS (nMOS) transistor will be described below. A p-channel MOS (pMOS) transistor is basically of the same structure as such an n-channel MOS transistor except that a different impurity is injected.

As shown in FIG. 1, semiconductor substrate 1 has trenches of uniform depth filled with an oxide film (STI: Shallow Trench Isolation) as device separating regions 2 for separating transistors from each other. On semiconductor substrate 1, there are deposited gate insulating film 3 comprising an oxide nitride film, gate electrode 4 comprising a polysilicon film with phosphorus (P) or arsenic (As) injected therein, and a pair of side walls 5 disposed on opposite sides of gate electrode 4 for introducing ions at different rates into semiconductor substrate 1 to form SD extension regions and source/drain regions.

Semiconductor substrate 1 has source/drain regions 6 with arsenic (As) diffused therein in the vicinity of the surface thereof between device separating regions 2 of STI and side walls 5, and SD extension regions 7 disposed between ends of gate electrode 4 and ends of side walls 5 and containing an impurity (n type) at a density higher than source/drain regions 6. Semiconductor substrate 1 also has pocket regions 8 disposed near ends of source/drain regions 6 (near a channel), and containing an impurity (p type) at a density higher than semiconductor substrate 1 or a well region.

SD extension regions 7 have their impurity density higher than source/drain regions 6 for reducing the parasitic resistance of source/drain ends near the channel to increase the ON current. Since SD extension regions 7 intensify the short channel effect, however, pocket regions 8 having their impurity density higher than semiconductor substrate 1 or the well region are included to increase the impurity density on both channel ends thereby to prevent the threshold voltage $V_{TH}$ from being lowered. As shown in FIG. 1, the length of gate electrode 4 in the direction across the channel is generally referred to as gate length L, and the length between SD extension regions 7 as effective channel length $L_{eff}$.

A method of manufacturing a semiconductor device having the transistor shown in FIG. 1 will be described below with reference to FIGS. 2A through 2I of the accompanying drawings. FIGS. 2A through 2I show successive steps of a typical fabrication process for transistors whose gate length is 0.13 µm.

First, STI is formed in semiconductor substrate 1 according to a known process, thus forming device separating regions 2 for separating transistors.

Then, photoresist film 11 is deposited on semiconductor substrate 1 in a region other than a region where a pMOS transistor is to be formed, by photolithography. Then, phosphorus (P) is injected into the region where the pMOS transistor is to be formed under the conditions of 350 KeV and $2 \times 10^{13}$ atms/cm², for example, to form an n well region (not shown), and arsenic (As) is further injected under the conditions of 100 KeV and $6 \times 10^{12}$ atms/cm² to form a channel region (not shown) of the pMOS transistor (see FIG. 2A).

Then, photoresist film 12 is deposited on semiconductor substrate 1 in a region other than a region where an nMOS transistor is to be formed, by photolithography. Then, boron (B) is injected into the region where the nMOS transistor is to be formed under the conditions of 150 KeV and $2 \times 10^{13}$ atms/cm², for example, to form a p well region (not shown), and boron is further injected under the conditions of 30 KeV and $2 \times 10^{12}$ atms/cm² to form a channel region (not shown) of the nMOS transistor (see FIG. 2B).

Then, the surface of semiconductor substrate 1 is thermally oxidized and nitrided in a mixed atmosphere of nitrogen ($N_2$) and oxygen ($O_2$), growing gate insulating films 3 to a thickness of about 2.6 nm. A polysilicon film having a thickness of about 150 nm, which serves as gate electrodes 4, is deposited on gate insulating films 3 by CVD (Chemical Vapor Deposition). Thereafter, a photoresist film (not shown) is formed on the polysilicon film and patterned to a desired shape by photolithography. The polysilicon film is then etched away to form gate electrodes 4 (see FIG. 2C).

Then, photoresist film 13 is deposited on semiconductor substrate 1 in the region other than the region where the nMOS transistor is to be formed, by photolithography. Then, arsenic (As) is injected vertically into the region where the nMOS transistor is to be formed under the conditions of 2 KeV and $5 \times 10^{14}$ atms/cm², for example, to form SD extension regions 7 of the nMOS transistor, and boron fluoride ($BF_2$) is further injected rotationally (at about 30° to the vertical direction) under the conditions of 30 KeV and $1.3 \times 10^{13}$ atms/cm² to form pocket regions 8 of the nMOS transistor (see FIG. 2D).

Then, after the assembly is processed by an RTA (Rapid Thermal Anneal) process at 950° C. for 10 sec. in a nitrogen atmosphere to eliminate point defects caused by the injection of arsenic (As) and boron fluoride ($BF_2$), photoresist film 14 is deposited on semiconductor substrate 1 in the region other than the region where the pMOS transistor is to be formed, by photolithography. Then, boron fluoride ($BF_2$) is injected vertically into the region where the pMOS transistor is to be formed under the conditions of 2.5 KeV and $5 \times 10^{14}$ atms/cm², for example, to form SD extension regions 7 of the pMOS transistor, and arsenic (As) is further injected rotationally (at about 30° to the vertical direction) under the conditions of 80 KeV and $1.5 \times 10^{13}$ atms/cm² to form pocket regions 8 of the pMOS transistor (see FIG. 2E).

Then, an oxide film (TEOS-NSG) is grown to a thickness of about 70 nm on semiconductor substrate 1 in covering relation to gate electrodes 4 by a thermal CVD process, and then etched back by a dry etching process to form side walls 5 on both sides of gate electrodes 4.

Then, photoresist film 15 is deposited on semiconductor substrate 1 in the region other than the region where the pMOS transistor is to be formed, by photolithography. Using the gate electrode 4 as a mask in the region where the pMOS transistor is to be formed, boron (B) is injected vertically under the conditions of 3 KeV and $5 \times 10^{15}$ atms/cm$^2$, for example, to form source/drain regions 6 of the pMOS transistor. In this ion implantation process, boron is also injected into gate electrode (polysilicon) 4 of the pMOS transistor (see FIG. 2F).

Then, photoresist film 16 is deposited on semiconductor substrate 1 in the region other than the region where the nMOS transistor is to be formed, by photolithography. Using the gate electrode 4 as a mask in the region where the nMOS transistor is to be formed, arsenic is injected vertically under the conditions of 30 KeV and $6 \times 10^{15}$ atms/cm$^2$, for example, to form source/drain regions 6 of the pMOS transistor. In this ion implantation process, arsenic is also injected into gate electrode (polysilicon) 4 of the nMOS transistor (see FIG. 2G).

The dopants injected into source/drain regions 6 are activated by the RTA process at 1000° C. for 10 sec. in a nitrogen atmosphere. Thereafter, a film of cobalt (Co) is deposited on gate electrodes 4 and source/drain regions 6 by a sputtering process, and thermally treated in a nitrogen atmosphere to grow cobalt silicide (CoSi$_2$) film 17 to a thickness of about 35 nm (see FIG. 2H).

Then, a plasma oxide film is grown to a thickness of about 100 nm on semiconductor substrate 1 in covering relation to gate electrodes 4 by a plasma CVD process, and then a BPSG (Boro-Phospho-Silicate Glass) film is deposited on the plasma oxide film. Then, the surface of the BPSG film is planarized to produce interlayer insulating film 18 by a CMP (Chemical Mechanical Polishing) process.

A photoresist film (not shown) is selectively deposited on interlayer insulating film 18 by photolithography, and interlayer insulating film 18 in openings in the photoresist film are etched away, thus forming contact holes 19 by which source/drain regions 6 and upper surfaces of interlayer insulating film 18 will be interconnected.

A film of titanium (Ti), as a barrier metal, having a thickness of about 10 nm, or a film of titanium nitride (TiN), as a barrier metal, having a thickness of about 50 nm is deposited on the inner wall surfaces of contact holes 19, and brought into intimate contact with the inner wall surfaces of contact holes 19 by the RTA process at 690° C. for 30 sec. Thereafter, a layer of tungsten (W), as an interconnection material, is embedded in contact holes 19 by the CVD process. Then, the surface of the assembly is planarized by the CMP process (see FIG. 2I). Thereafter, interconnections to source/drain regions 6 are formed according to a known process.

Modern semiconductor devices are suffering from the problem of dimensional variations posed by reduced transistor sizes that have resulted from highly integrated semiconductor device designs in recent years. Particularly problematic are variations in the gate dimensions that tend to greatly affect the transistor characteristics.

Gate electrodes may be produced with highly accurate dimensions using electron beams or X-rays having short wavelengths as exposure light sources. However, since exposure apparatus which employ electron beams or X-rays are expensive, they are responsible for an increase in the cost of semiconductor devices fabricated using those exposure apparatus.

For example, it is unavoidable to use electron beams or X-rays for fabricating smaller transistors whose gate length is 0.1 μm or less. However, for the fabrication of larger transistors whose gate length L ranges from 0.1 to 0.18 μm, it is preferable to use existing light sources such as exposure light sources, e.g., a KrF (Krypton-fluoride) laser, used to fabricate transistors whose gate length L is up to 0.25 μm. Since the KrF laser beam has a wavelength of about 0.24 μm, however, it necessarily causes gate dimension variations when used as an exposure light source for the fabrication of transistors whose gate length L is 0.18 μm or shorter.

If a certain system is to be constructed of a plurality of types of semiconductor devices, then it needs to be designed in view of not only the average performance of the semiconductor devices but also possible worst characteristic variations thereof in order to achieve desired system capabilities. It therefore is highly important to uniformize the capabilities of the individual semiconductor devices.

One process of reducing such characteristic variations of the semiconductor devices is a feedback process which measures the characteristics of fabricated semiconductor devices of one lot to determine variations from design values and modify process parameters of process steps for a next lot of semiconductor devices in order to correct such variations.

However, such a feedback process is disadvantageous in that it is not immediately effective to correct variations from design values for the present lot of semiconductor devices. If gate length variations are caused for the reasons described above, then since the variations differ from lot to lot or from product to product, the process is not stable and the process parameters do not converge to desired values.

SUMMARY OF THE INVENTION

It is therefore an object of the present invention to provide a method of manufacturing a semiconductor device to achieve uniform transistor characteristics without changing circuit performance and reliability.

To achieve the above object, there is provided in accordance with the present invention a method of manufacturing a semiconductor device having a transistor with SD extension regions and pocket regions, comprising the steps of formulating the relationship between the difference between design and measured values of a gate length of a gate electrode of the transistor and a dose of an impurity to be injected into the SD extension regions or pocket regions which is necessary to equalize characteristics of the transistor to design values, measuring the gate length of the gate electrode which is produced by photolithography and etching process, and adjusting the dose of the impurity to be injected into the SD extension regions or the pocket regions to bring deviations of the characteristics of the transistor from the design values into a predetermined range, based on the measured value of the gate length and the formulated relationship. In this method, since the characteristics of transistors of one lot can be brought closely to design values, it is possible to manufacture transistors of uniform characteristics which are not changed in circuit performance and reliability.

The dose of the impurity in the SD extension regions or the dose of the impurity in the pocket regions is used as a process parameter for adjustment. Therefore, the characteristics of the transistor can be brought closely to the design values without causing a change in the reliability of the transistor and the performance of a circuit that is composed of the transistor that has been adjusted.

The above and other objects, features, and advantages of the present invention will become apparent from the following description with reference to the accompanying drawings which illustrate examples of the present invention.

BRIEF DESCRIPTION OF THE DRAWINGS

FIG. 11A is a graph showing the relationship of bottom and side capacitances of nMOS and pMOS transistors to doses in a pocket region;

FIG. 11B is a graph showing the relationship of the bottom and side capacitances to energies with which ions are injected into the pocket regions in the nMOS and pMOS transistors;

FIG. 11C is a graph showing the relationship of the bottom and side capacitances of the nMOS and pMOS transistors to doses in an SD extension region;

FIG. 12A is a graph showing the relationship of ON currents $I_{on}$ to maximum substrate currents $I_{submax}$ of an nMOS transistor;

FIG. 12B is a graph showing the relationship of the life time of a hot carrier to the maximum substrate currents $I_{submax}$ of the nMOS transistor;

FIG. 14 is a diagram showing results of a review conducted to ascertain whether a feed-forward process is applicable to process parameters or not.

DETAILED DESCRIPTION OF THE PREFERRED EMBODIMENTS

A method of manufacturing a semiconductor device according to the present invention employs a feed-forward process for adjusting variations in transistor characteristics in one lot which have been caused by gate dimension variations within a predetermined range by changing process parameters of a subsequent process step for the same lot.

Figure 1:
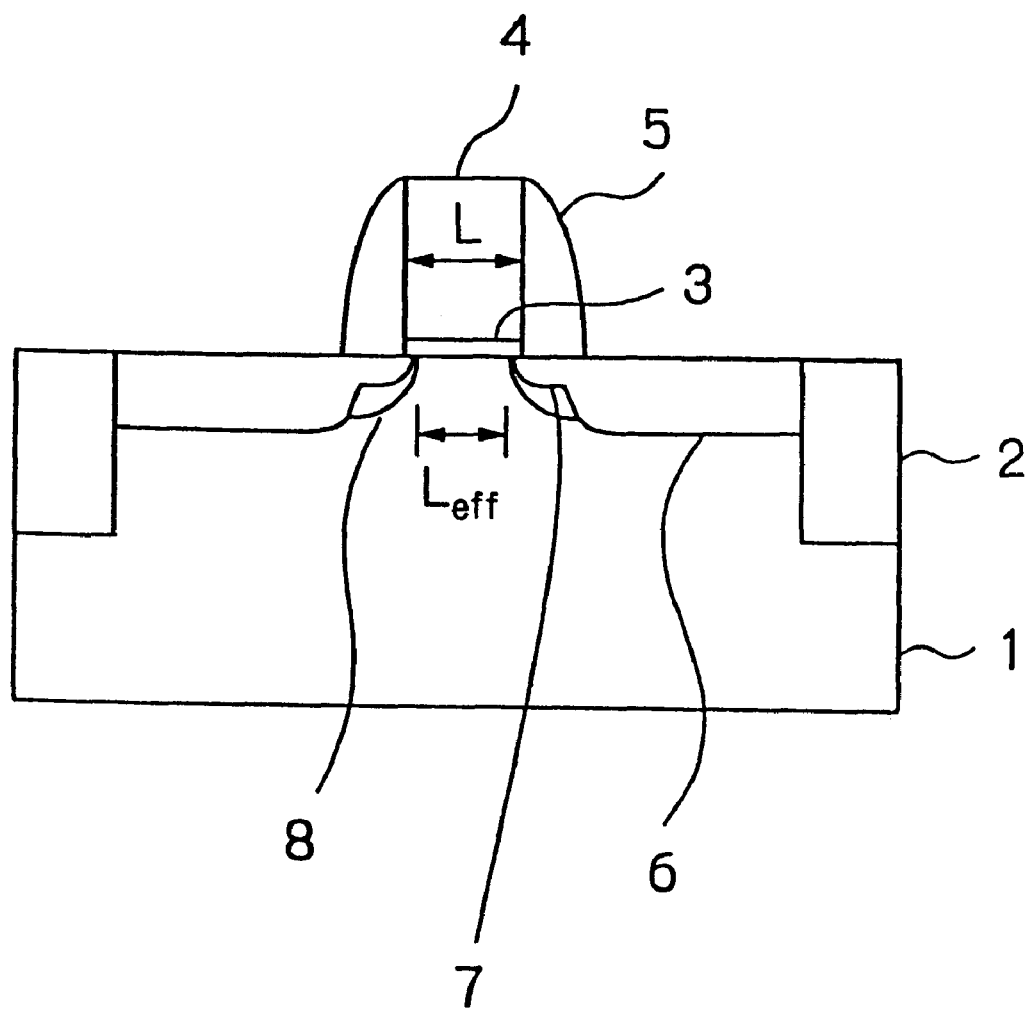
FIG. 1 is a sectional side elevational view of a transistor of a semiconductor device.
Figure 2A:
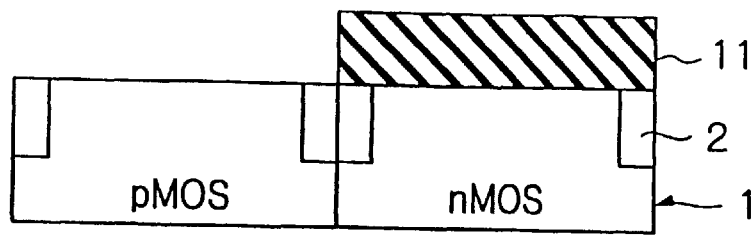
FIGS. 2A through 2I are sectional side elevational views showing successive steps of a method of manufacturing a semiconductor device.
Figure 2B:
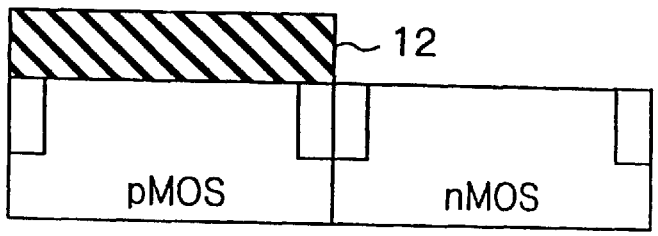
Figure 2C:
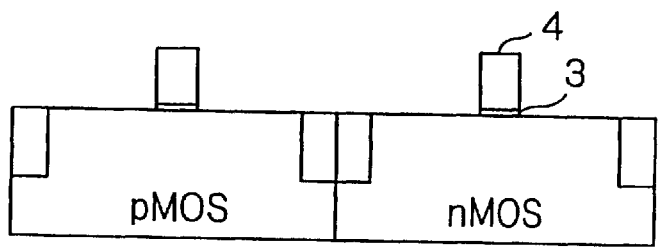
Figure 2D:
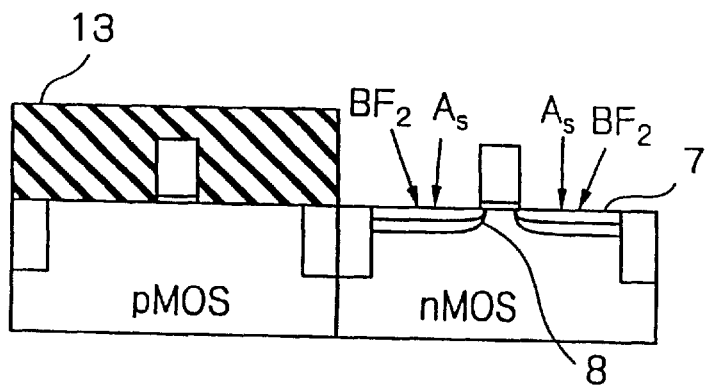
Figure 2E:
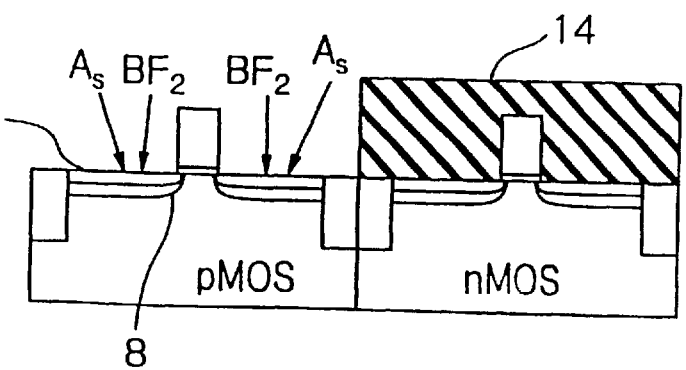
Figure 2F:
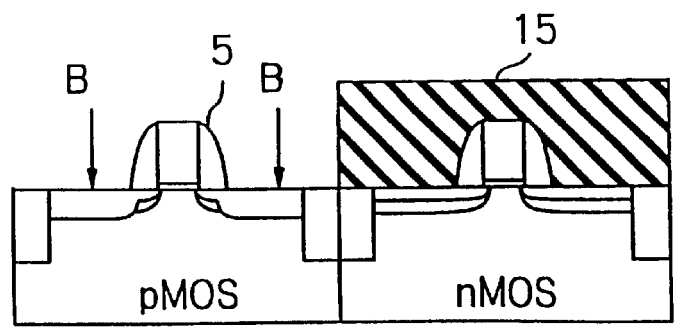
Figure 2G:
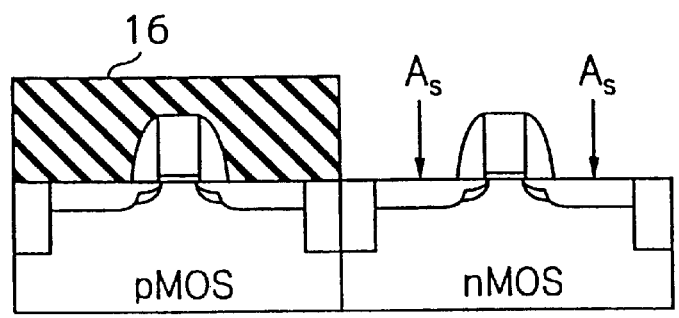
Figure 2H:
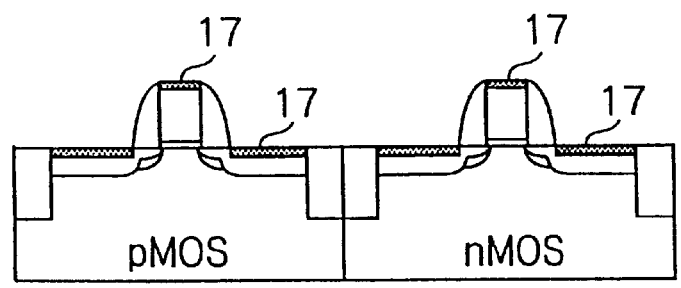
Figure 2I:
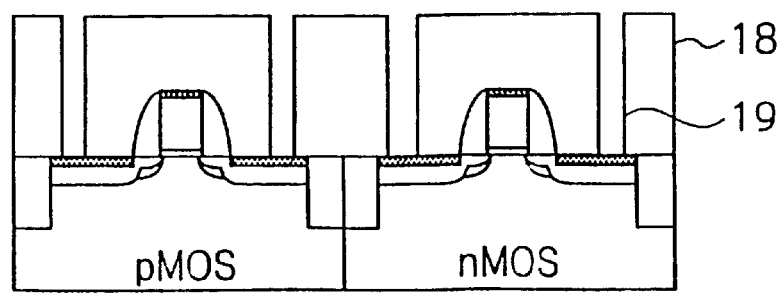

Specifically, the gate length L of the gate electrode produced by photolithography and etching process as shown in FIG. 2C is measured, and a dose in SD extension regions 7 or pocket regions 8 formed in the steps shown in FIGS. 2E and 2D is adjusted based on the measured value to correct variations from design values of transistor characteristics.

If the transistor characteristics are only to be brought close to the design values, then the transistor characteristics can be adjusted by changing not only the dose in SD extension regions 7 or pocket regions 8 but also the energy with which ions are injected into the pocket regions and an RTA processing temperature after ions have been injected into the SD extension regions (in only nMOS transistors).

Figure 3A:
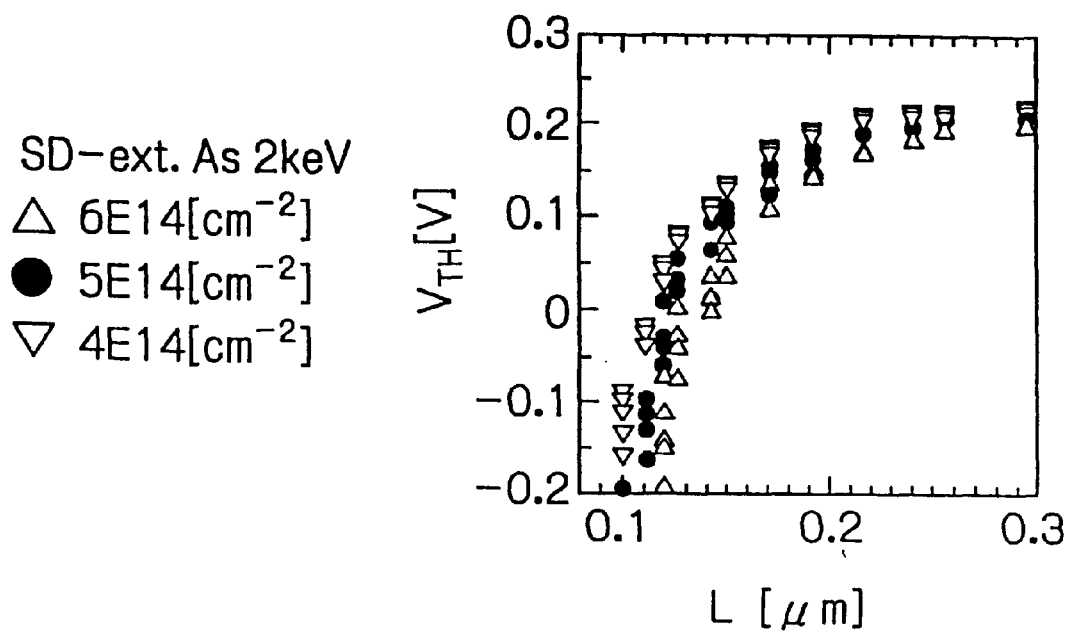
FIG. 3A is a graph showing the relationship of a threshold voltage $V_{TH}$ to a gate length L.
Figure 3B:
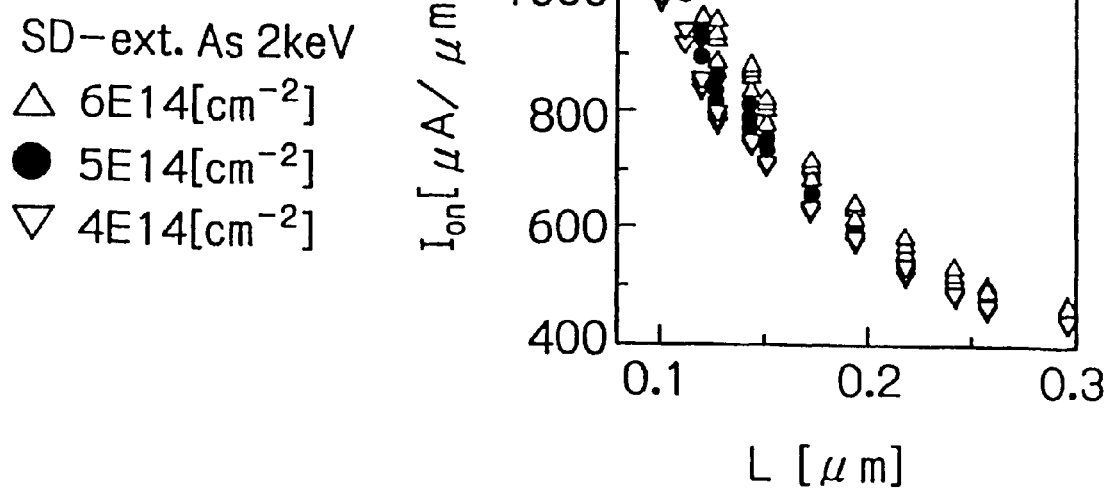
FIG. 3B is a graph showing the relationship of an ON current $I_{on}$ to the gate length L.
Figure 4A:
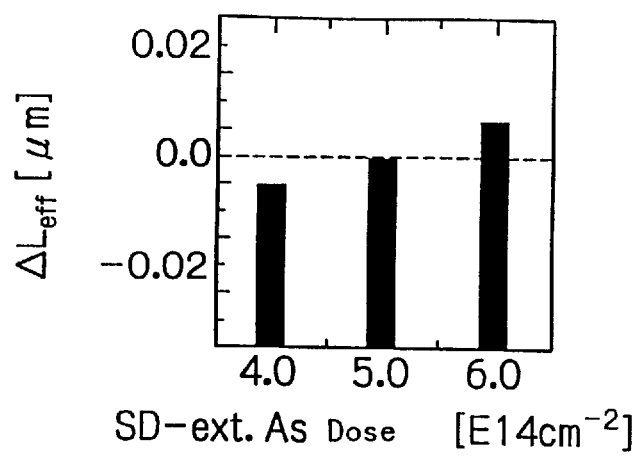
FIG. 4A is a graph showing the relationship of changes $\Delta L_{eff}$ in an effective channel length to doses in an SD extension region.
Figure 4B:
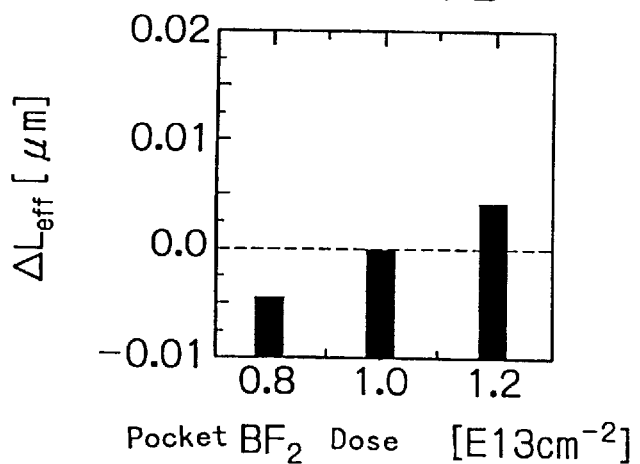
FIG. 4B is a graph showing the relationship of changes $\Delta L_{eff}$ in an effective channel length to doses in a pocket region.
Figure 4C:
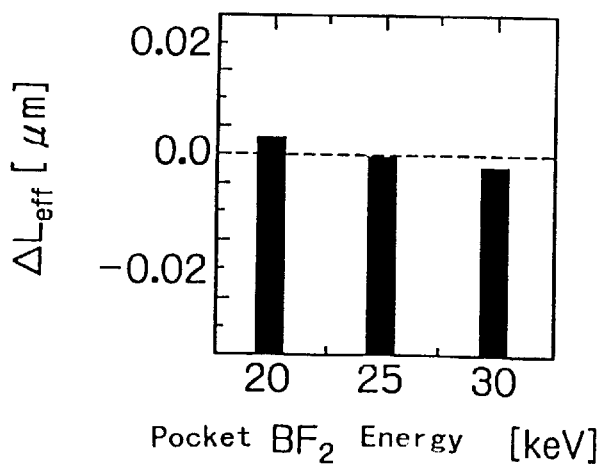
FIG. 4C is a graph showing the relationship of changes $\Delta L_{eff}$ in an effective channel length to energies with which an impurity is injected into the pocket region.
Figure 5:
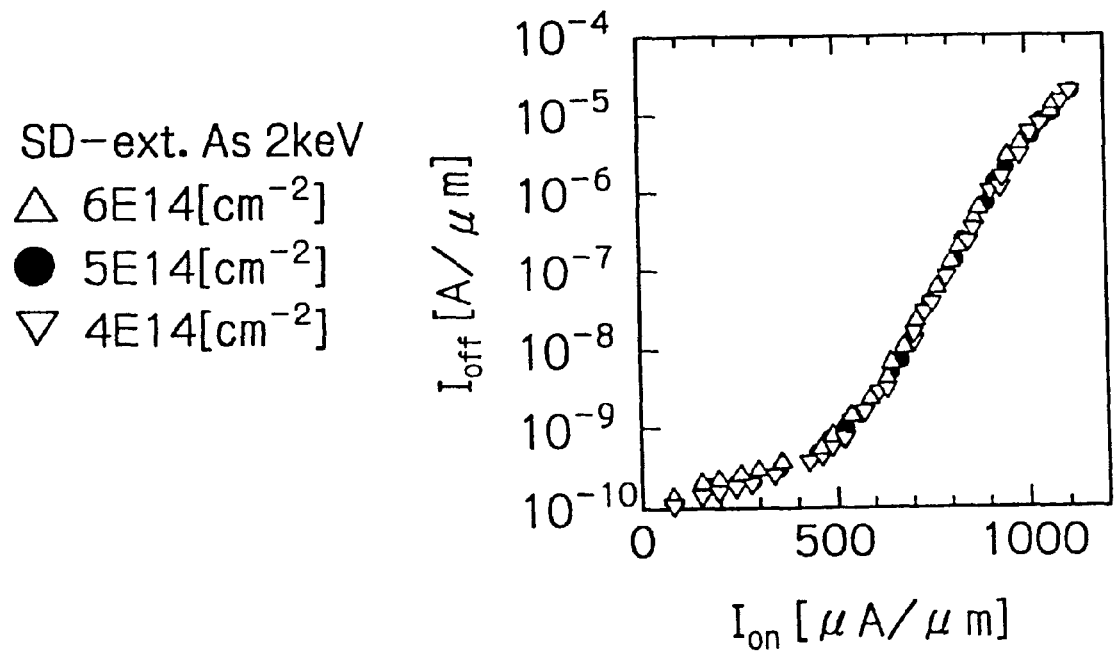
FIG. 5 is a graph showing the relationship of OFF currents $I_{off}$ to ON currents $I_{on}$ of a transistor.
Figure 6A:
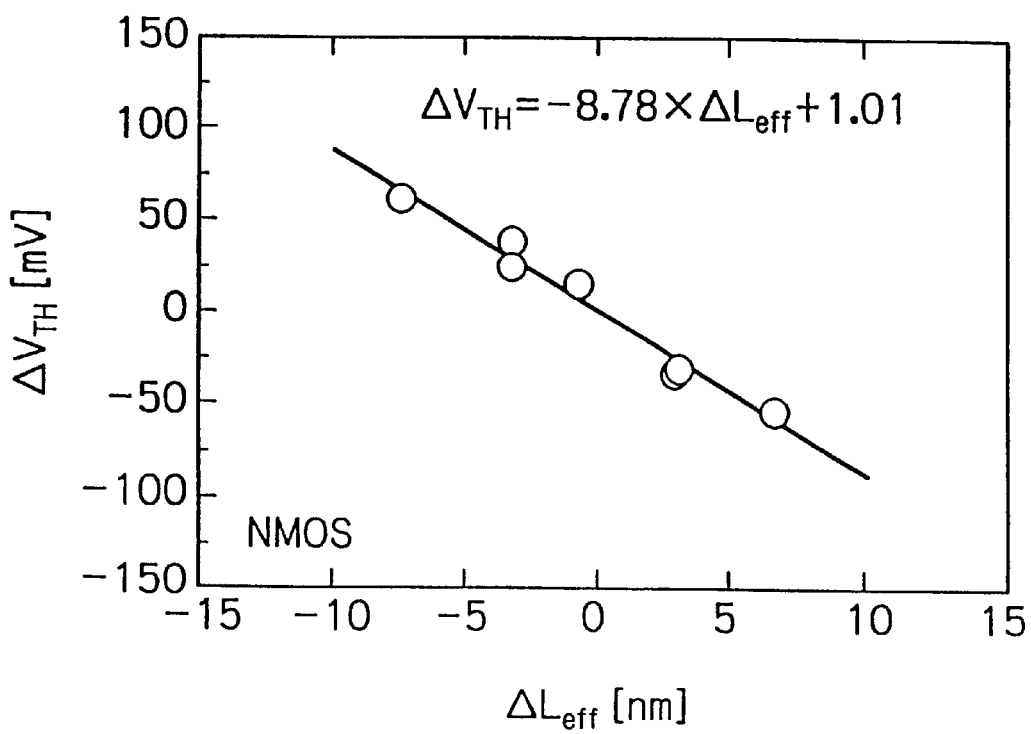
FIG. 6A is a graph showing the relationship of changes $\Delta V_{TH}$ in a threshold voltage $V_{TH}$ to changes $\Delta L_{eff}$ in an effective channel length of an nMOS transistor.
Figure 6B:
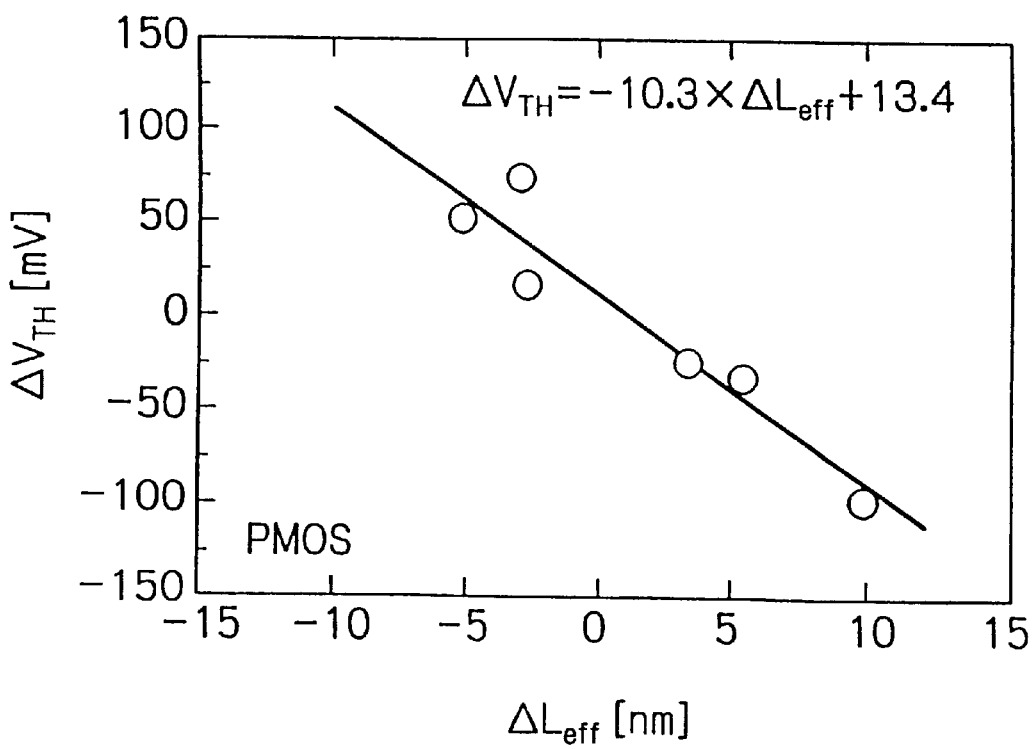
FIG. 6B is a graph showing the relationship of changes $\Delta V_{TH}$ in a threshold voltage $V_{TH}$ to changes $\Delta L_{eff}$ in an effective channel length of a pMOS transistor.
Figure 7A:
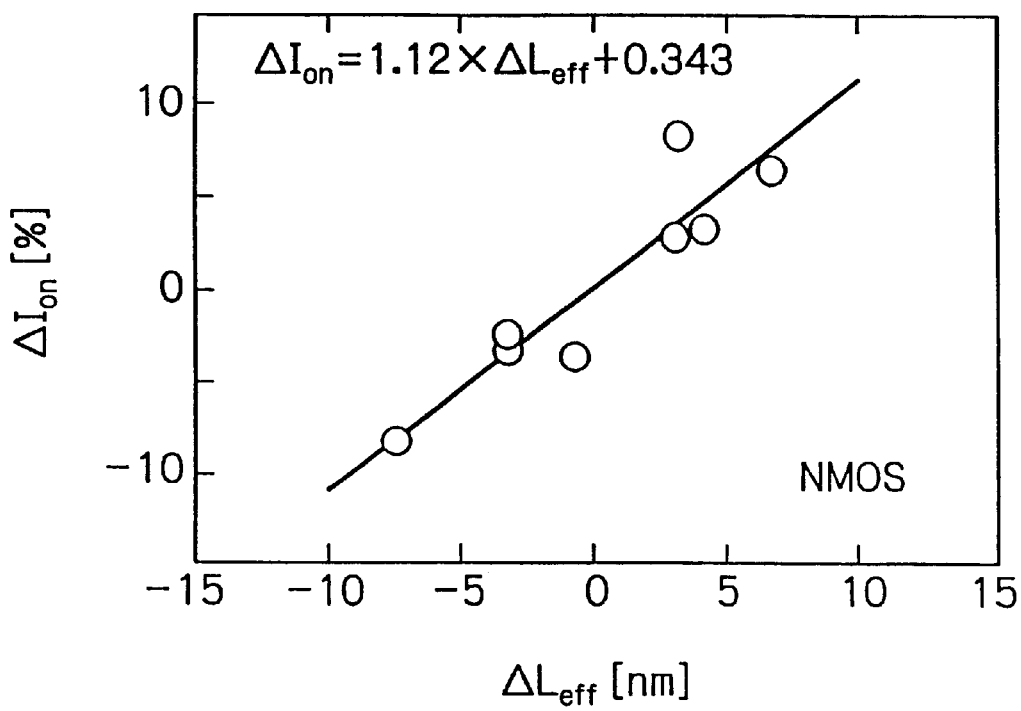
FIG. 7A is a graph showing the relationship of changes $\Delta I_{on}$ in an ON current $I_{on}$ to changes $\Delta L_{eff}$ in an effective channel length of an nMOS transistor.
Figure 7B:
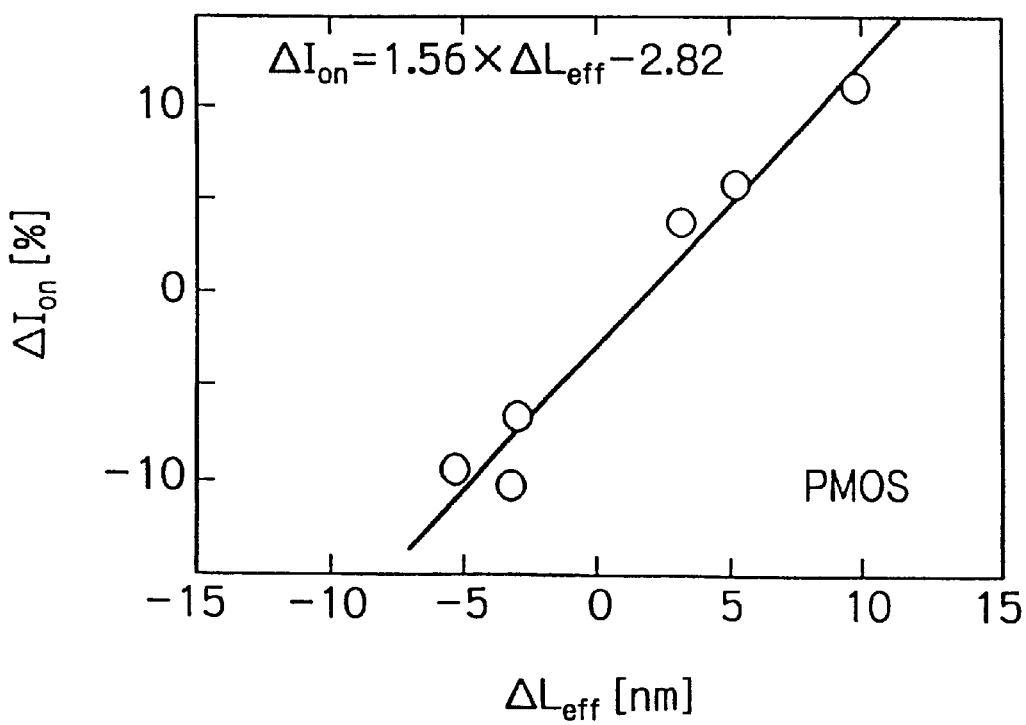
FIG. 7B is a graph showing the relationship of changes $\Delta I_{on}$ in an ON current $I_{on}$ to changes $\Delta L_{eff}$ in an effective channel length of a pMOS transistor.

The ability to bring the transistor characteristics close to the design values by changing the process parameters will be described below with reference to FIGS. 3A, 3B through 7A, 7B. FIGS. 3A, 3B show how the threshold voltage of an nMOS transistor changes when the dose in the SD extension regions (SD-ext) changes to $4 \times 10^{14}$, $5 \times 10^{14}$, and $6 \times 10^{14}$ atms/cm$^2$. FIGS. 4A through 4C show changes $\Delta L_{eff}$ in an effective channel length $L_{eff}$ of the nMOS transistor which are caused when each process parameter changes with a gate length L=0.13 μm. FIG. 5 shows the characteristics of OFF currents $I_{off}$ to ON currents $I_{on}$ of an nMOS transistor when the effective channel length $L_{eff}$ is set to a design value at a gate length L=0.13 μm and the dose in the SD extension regions (SD-ext) changes to $4 \times 10^{14}$, $5 \times 10^{14}$, and $6 \times 10^{14}$ atms/cm$^2$.

As shown in FIG. 3A, the threshold voltage $V_{TH}$ of the transistor greatly varies depending on changes in the gate length L. When the gate length L is 0.18 μm or less, in particular, since a short channel effect appears strongly, the threshold voltage $V_{TH}$ greatly varies with respect to a slight change in the gate length L. Since the threshold voltage $V_{TH}$ varies when the gate length L changes, the ON current $I_{on}$ of the nMOS transistor also greatly varies when the gate length L slightly changes, as shown in FIG. 3B. Therefore, variations in the gate length L largely affect the characteristics of individual transistors when they are manufactured.

As shown in FIG. 4A, when the dose in the SD extension regions changes, the change $\Delta L_{eff}$ in the effective channel length $L_{eff}$ changes. Therefore, it can be seen that the effective channel length $L_{eff}$ of the transistor can be modified by changing the dose in the SD extension regions.

As shown in FIGS. 4B, 4C, the change $\Delta L_{eff}$ in the effective channel length $L_{eff}$ also changes when the dose in the pocket regions and the energy with which impurity ions are injected into the pocket regions are changed. Therefore, it can be seen that the effective channel length $L_{eff}$ of the transistor can also be modified by changing the dose in the pocket regions and the energy with which impurity ions are injected into the pocket regions.

Though not shown in FIGS. 4A–4C, since the change $\Delta L_{eff}$ in the effective channel length $L_{eff}$ also changes when an RTA processing temperature is changed after ions have been injected into the SD extension regions. Consequently, the effective channel length $L_{eff}$ of the transistor can also be modified by changing the RTA processing temperature. FIGS. 4A through 4C show how the change $\Delta L_{eff}$ in the effective channel length $L_{eff}$ changes when the dose or energy changes to +/−20% from the central value thereof.

When the dose in the SD extension regions (SD-ext) changes, the relationship of OFF currents $I_{off}$ to ON currents $I_{on}$ of a transistor exhibits the same characteristics if the effective channel length $L_{eff}$ remains the same, as shown in FIG. 5. Though not shown in FIG. 5, the relationship of OFF currents $I_{off}$ to ON currents $I_{on}$ of a transistor also exhibits the same characteristics if the dose in the pocket regions or the energy with which ions are injected into the pocket regions are changed.

As shown in FIGS. 6A, 6B and 7A, 7B, a change $\Delta V_{TH}$ in a threshold voltage $V_{TH}$ and a change $\Delta I_{on}$ in an ON current $I_{on}$ of a transistor depend only on a change $\Delta L_{eff}$ in an effective channel length $L_{eff}$ of the transistor. It will be understood from FIGS. 6A, 6B and 7A, 7B that these changes are uniquely related to variations (to about +/−15 nm) in the effective channel length $L_{eff}$ in a manner that can be formulated.

It follows, therefore, that even when the dose in the SD extension regions, the dose in the pocket regions, the energy with which ions are injected into the pocket regions, and the RTA processing temperature after ions have been injected into the SD extension regions are different, the transistor characteristics remain the same if the effective channel length $L_{eff}$ is the same. Specifically, even if the measured value of the gate length L of the transistor deviates from a design value, the transistor characteristics can restore designed performance characteristics by adjusting the dose in the SD extension regions, the dose in the pocket regions, the energy with which ions are injected into the pocket regions, and the RTA processing temperature after ions have been injected into the SD extension regions to equalize the effective channel length $L_{eff}$ to the design value.

Based on the relationship shown in FIGS. 4A–4C, 6A, 6B, and 7A, 7B, the dose in the SD extension regions, the dose in the pocket regions, the energy with which ions are injected into the pocket regions, and the RTA processing temperature after ions have been injected into the SD extension regions, which are required to equalize the transistor characteristics to design values, can be formulated using the difference $\Delta L$ between the measured and design values of the gate length L. Specifically, if the design value of the gate length L is 0.13 $\mu$m, then the above doses, energy, and RTA processing temperature can be expressed as follows:

| NMOS | |
|---|---|
| SD-ext.-As dose [cm$^{-2}$] | Dose = (1.5E+13) × $\Delta L$ + 5E14 |
| Pocket BF$_2$ dose [cm$^{-2}$] | Dose = (−4.1E+11) × $\Delta L$ + 1E13 |
| Pocket BF$_2$ energy [KeV] | Energy = (−1.2) × $\Delta L$ + 25 |
| SD-ext. RTA [° C.] | T = (6.4) × $\Delta L$ + 1010 |
| PMOS | |
| SD-ext.-BF$_2$ dose [cm$^{-2}$] | Dose = (2.7E13) × $\Delta L$ + 5E14 |
| Pocket As dose [cm$^{-2}$] | Dose = (−4.5E11) × $\Delta L$ + 1.3E13 |
| Pocket As energy [KeV] | Energy = (−2.1) × $\Delta L$ + 85 |

"SD-ext" represents the SD extension regions, "Pocket" represents the pocket regions, As, BF$_2$ represent the impurities injected into the respective regions. Since constants used in the above equations are different with different design conditions and manufacturing apparatus, necessary data may be obtained by a manufacturing apparatus that is used in the actual process and formulated as described above.

The effect that changing process parameters has on circuit performance and reliability will be described below with reference to FIGS. 8 through 11A–11C.

First, the effect that changing the dose in the SD extension regions, the dose in the pocket regions, and the energy with which ions are injected into the pocket regions of the transistor has on circuit performance will be described below.

Figure 8:
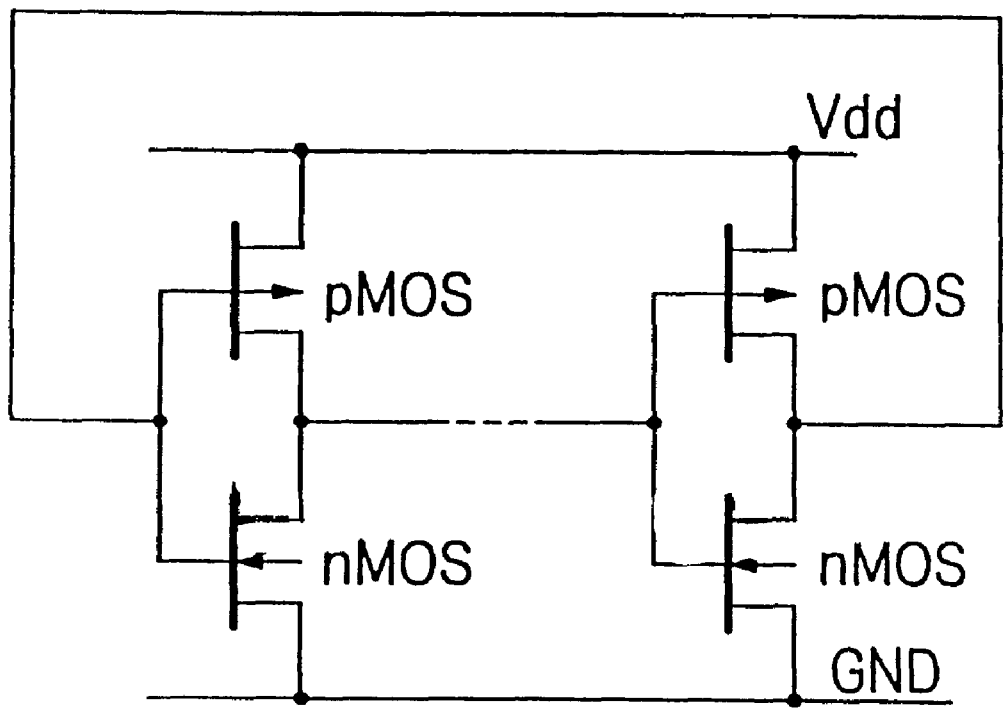
FIG. 8 is a circuit diagram of a ring oscillator used to evaluate circuit performance.
Figure 9:
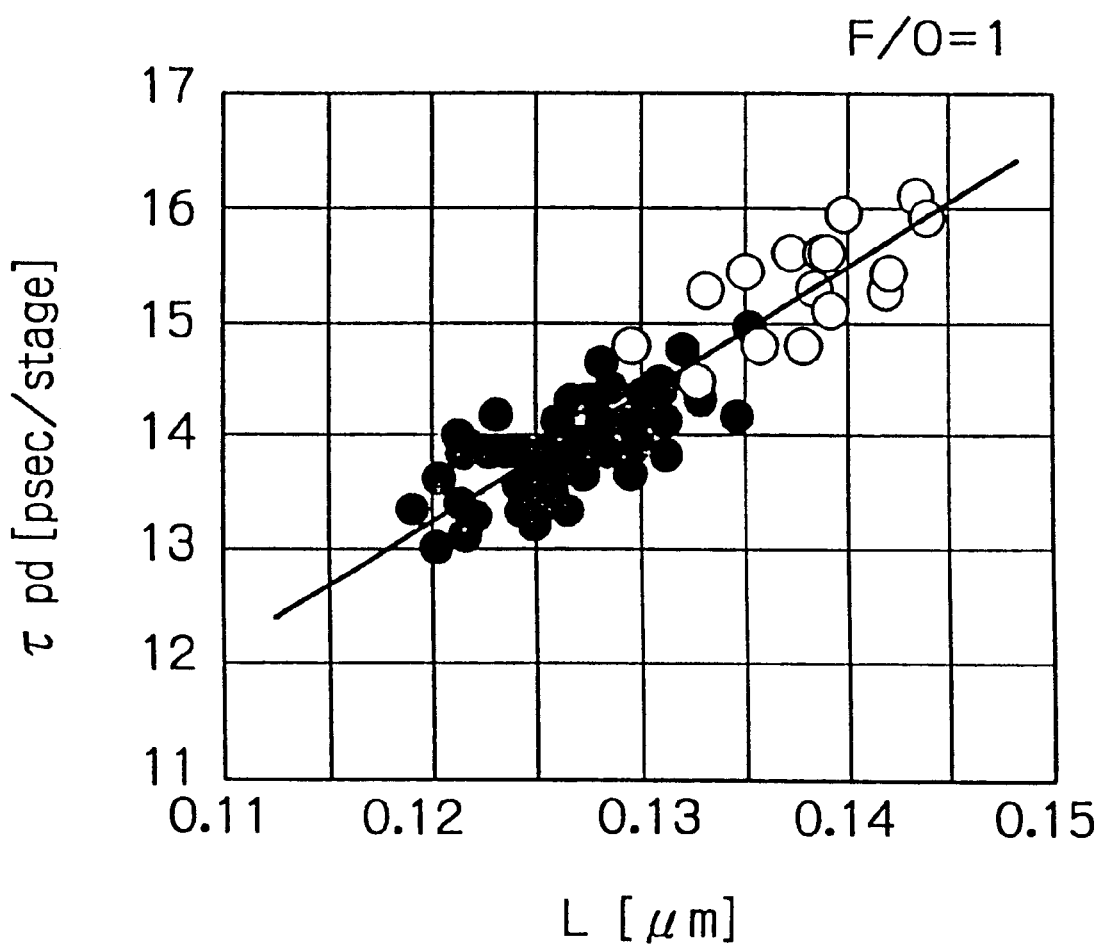
FIG. 9 is a graph showing how a delay time changes when the gate length of transistors of the ring oscillator shown in FIG. 8 changes.

According to the present invention, a ring oscillator shown in FIG. 8 is constructed of nMOS and pMOS transistors whose characteristics have been equalized to design values by changing various process parameters, and the effect on circuit performance is evaluated based on the characteristics of the ring oscillator. FIG. 9 shows a graph of delay times $\tau_{pd}$ of the circuit determined from oscillation frequencies of the ring oscillator at the time the gate length L (measured) of each transistor is equal to and slightly larger than the design value. FIG. 10 shows a graph of delay times $\tau_{pd}$ of the circuit determined from oscillation frequencies of the ring oscillator at the time ON currents of the nMOS and pMOS transistors are equalized by changing the dose in the SD extension regions, the dose in the pocket regions, and the energy with which ions are injected into the pocket regions of transistors whose gate length L deviates from the design value. The bottom capacitance shown in FIGS. 11A–11C is the capacitance between source/drain regions and a semiconductor substrate directly therebeneath, and the side capacitance shown in FIGS. 11A–11C is the capacitance between source/drain regions and a device separating region.

According to the process of changing the RTA processing temperature after ions have been injected into the SD extension regions, since only the effective channel length $L_{eff}$ of the nMOS transistor can be adjusted, the graphs of FIGS. 10, 11A–11C do not contain data when the RTA processing temperature is changed. It seems, however, that any change in the junction capacitance of the nMOS transistor that is caused by changing the RTA processing temperature is small. Though at least the effect of a change in the performance of the pMOS transistor that operates as a load on circuit performance seems to be large, since the pMOS transistor is not subject to the RTA process, any degradation of circuit performance due to the RTA process is considered to be small.

As shown in FIG. 8, the ring oscillator comprises a series-connected array of pairs of pMOS and nMOS transistors that are connected in push-pull configuration, and is a circuit that is self-oscillated with an output from its final stage fed back as an input to a first stage thereof. The oscillation frequency of the ring oscillator is equal to the reciprocal of the delay time $\tau_{pd}$ of the entire circuit that is composed of the nMOS and pMOS transistors.

As shown in FIG. 9, it can be seen that if the gate length L changes about 10 nm, then the delay time of the ring oscillator varies about 10%. In order to reduce such a tendency, the dose in the SD extension regions, the dose in the pocket regions, or the energy with which ions are injected into the pocket regions is changed to equalize the ON currents $I_{on}$ of the nMOS and pMOS transistors to respective design values.

At this time, as shown in FIG. 10, the delay time of the ring oscillator may not necessarily become the same. Particularly, the delay time $\tau_{pd}$ is degraded when the energy with which ions are injected into the pocket regions is changed.

The reason for the degraded delay time $\tau_{pd}$ appears to be that when the energy with which ions are injected into the pocket regions is changed, the characteristics of the bottom and side capacitances of the pMOS transistors are largely changed. Specifically, the junction capacitance is changed to change the delay time of the pMOS transistors, thus degrading the delay time $\tau_{pd}$ of the ring oscillator.

The effect that changing the dose in the SD extension regions, the dose in the pocket regions, the energy with which ions are injected into the pocket regions, and the RTA processing temperature after ions have been injected into the SD extension regions of the transistor has on reliability of the transistor will be described below. In FIGS. 12A, 12B, the maximum substrate current $I_{submax}$ represents a maximum current flows from the source or drain into the semiconductor substrate. It is known in the art that the maximum substrate current $I_{submax}$ affects the life of a hot carrier which is inherent in the nMOS transistors.

NBTI (Negative Bias Temperature Instability) is inherent in the pMOS transistors, and represents a phenomenon in which a transistor characteristic, i.e., the threshold voltage $V_{TH}$, gradually changes when the transistor is stressed, i.e., held at a high temperature. The NBTI life is judged as having expired when a change $\Delta V_{TH}$ in the threshold voltage $V_{TH}$ reaches a certain value.

As shown in FIG. 12A, the maximum substrate current $I_{submax}$ which is correlated to the hot carrier life of the nMOS transistors is uniquely related to the ON current $I_{on}$. Specifically, when the ON current $I_{on}$ is set to a certain value, the maximum substrate current $I_{submax}$ is determined.

As shown in FIG. 12B, the maximum substrate current $I_{submax}$ is substantially uniquely related to the life time of the hot carrier. When the energy with which ions are injected into the pocket regions is changed to a low level, the maximum substrate current $I_{submax}$ is no longer uniquely related to the life time of the hot carrier. Furthermore, the unique relationship between the maximum substrate current $I_{submax}$ and the life time of the hot carrier is lost when the RTA processing temperature after ions have been injected into the SD extension regions is changed to a high temperature of 1030° C.

The absence of the above unique relationship does not indicate a degradation of the hot carrier life, but is not preferable because the hot carrier life is more changed than when the doses in the SD extension regions and the pocket regions are changed.

Figure 13:
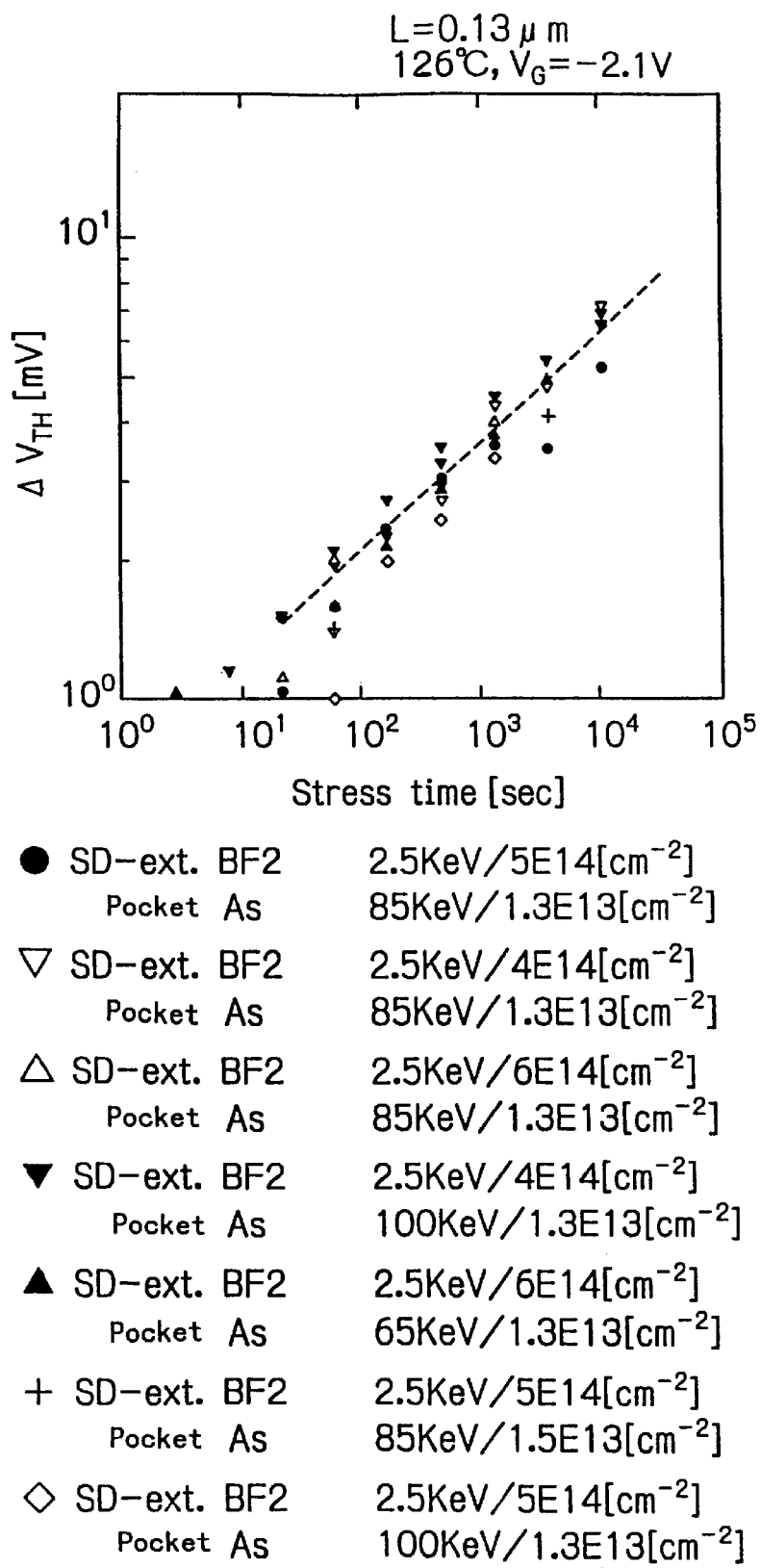
FIG. 13 is a graph showing the relationship of changes $\Delta V_{TH}$ in a threshold voltage $V_{TH}$ to stress times, the graph illustrating an effect on the NBTI life time of a pMOS transistor.

As shown in FIG. 13, the change $\Delta V_{TH}$ in the threshold voltage $V_{TH}$ is substantially uniquely related to the stress time for which the pMOS transistors are stressed. Therefore, it is considered that changing the dose in the SD extension regions, the dose in the pocket regions, the energy with which ions are injected into the pocket regions has no effect on the NBTI life.

To summarize the foregoing analysis, process parameters to which the feed-forward process according to the present invention is applicable are set forth in a table shown in FIG. 14. In FIG. 14, "SD-ext" represents the SD extension regions, "NP" represents no problem caused when the process parameter changes, and "x" represents a case that cannot be analyzed.

As shown in FIG. 14, the transistor characteristics suffer no problem when the dose in the SD extension regions, the dose in the pocket regions, the energy with which ions are injected into the pocket regions, and the RTA processing temperature after ions have been injected into the SD extension regions (in only the nMOS transistors) are changed. However, the circuit performance is degraded when the energy with which ions are injected into the pocket regions is changed. The reliability is changed when the energy with which ions are injected into the pocket regions is changed and also when the RTA processing temperature after ions have been injected into the SD extension regions in the nMOS transistors is changed.

Therefore, it is preferable that variations of the transistor characteristics from design values caused by variations in the gate length L of the gate electrode that is formed by photolithography be minimized by adjusting the dose in the SD extension regions and the dose in the pocket regions. In this manner, it is possible to manufacture transistors of uniform characteristics which are not changed in circuit performance and reliability.

The gate length L should preferably vary in a range of +/−20% according to the present invention. If the measured value of the gate length L is greater than the design value by 20% or more, and the dose in the pocket regions is reduced to shorten the effective channel length $L_{eff}$, then since the SD extension regions whose conductivity type is different from that of the pocket regions become simultaneously deeper, desired transistor characteristics may possibly not be obtained even when the effective channel length $L_{eff}$ is of the design value. Such a drawback is prevented if variations in the gate length L are in the range of +/−20% and the above adjustments are carried out based on the process parameters.

The method of manufacturing a semiconductor device according to the present invention, as described above, is indispensable in reducing variations in the transistor characteristics when a semiconductor device having transistors whose gate length is 0.18 μm or less. However, the method is also applicable to the fabrication of a semiconductor device having transistors whose gate length is greater than 0.18 μm.

Examples of the present invention will be described below.

1st Example (The doses in SD extension regions of pMOS and nMOS transistors are corrected)

First, device separating regions are formed in a semiconductor substrate, n and p well regions are formed therein, and a gate insulating film and a gate electrode are formed therein. Thereafter, a gate length L is measured. The design value of the gate length L is 0.13 μm.

Then, arsenic (As) is injected vertically into a region where an nMOS transistor is to be formed, at 2 KeV, thus forming SD extension regions of the nMOS transistor. The dose of arsenic has a design value of $5 \times 10^{14}$ atms/cm². If the measured value of the gate length L is 0.12 μm, then the dose of arsenic may be corrected into $3.5 \times 10^{14}$ atms/cm², and if the measured value of the gate length L is 0.14 μm, then the dose of arsenic may be corrected into $6.5 \times 10^{14}$ atms/crU².

Then, boron fluoride ($BF_2$) is further injected rotationally to form pocket regions of the nMOS transistor, after which the assembly is subjected to the RTA process.

Then, boron fluoride is injected vertically into a region where a pMOS transistor is to be formed, at 2.5 KeV, thus forming SD extension regions of the pMOS transistor. The dose of boron fluoride has a design value of $5 \times 10^{14}$ atms/cm². If the measured value of the gate length L is 0.12 μm, then the dose of boron fluoride may be corrected into $2.3 \times 10^{14}$ atms/cm², and if the measured value of the gate length L is 0.14 μm, then the dose of boron fluoride may be corrected into $7.7 \times 10^{14}$ atms/cm².

Then, arsenic is further injected rotationally to form pocket regions of the pMOS transistor, after which side walls are deposited. Then, boron fluoride is injected to form source/drain regions of the pMOS transistor, and arsenic is injected to form source/drain regions of the nMOS transistor. The assembly is then subjected to the RTA process to activate the dopants in the source/drain regions. Thereafter, a cobalt silicide film is deposited on the gate electrode and the source/drain regions, and then an interlayer insulating film is deposited. Thereafter, contact holes are formed in the source/drain regions, and then interconnections are deposited.

2nd Example (The doses in pocket regions of pMOS and nMOS transistors are corrected)

First, device separating regions are formed in a semiconductor substrate, n and p well regions are formed therein, and a gate insulating film and a gate electrode are formed therein. Thereafter, a gate length L is measured. The design value of the gate length L is 0.13 μm.

Then, arsenic is injected to form SD extension regions of an nMOS transistor. Then, boron fluoride is injected rotationally (at about 30° to the vertical direction) at 30 KeV to form pocket regions of the nMOS transistor. The dose of boron fluoride has a design value of $1.0 \times 10^{13}$ atms/cm$^2$. If the measured value of the gate length L is 0.12 μm, then the dose of boron fluoride may be corrected into $1.4 \times 10^{13}$ atms/cm$^2$, and if the measured value of the gate length L is 0.14 μm, then the dose of boron fluoride may be corrected into $0.6 \times 10^{14}$ atms/cm$^2$. Thereafter, the assembly is subjected to the RTA process, and boron fluoride is injected to form SD extension regions of a pMOS transistor.

Then, arsenic is injected rotationally (at about 30° to the vertical direction) under the condition of 80 KeV to form pocket regions of the pMOS transistor. The dose of arsenic has a design value of $1.3 \times 10^{13}$ atms/cm$^2$. If the measured value of the gate length L is 0.12 μm, then the dose of arsenic may be corrected into $1.8 \times 10^{13}$ atms/cm$^2$, and if the measured value of the gate length L is 0.14 μm, then the dose of arsenic may be corrected into $0.8 \times 10^{13}$ atms/cm$^2$.

Thereafter, side walls are deposited, and boron fluoride is injected to form source/drain regions of the pMOS transistor, and arsenic is injected to form source/drain regions of the nMOS transistor. The assembly is then subjected to the RTA process to activate the dopants in the source/drain regions. Thereafter, a cobalt silicide film is deposited on the gate electrode and the source/drain regions, and then an interlayer insulating film is deposited. Thereafter, contact holes are formed in the source/drain regions, and then interconnections are deposited.

3rd Example (Both the dose in pocket regions and the dose in SD extension regions of pMOS and nMOS transistors are corrected)

First, device separating regions are formed in a semiconductor substrate, n and p well regions are formed therein, and a gate insulating film and a gate electrode are formed therein. Thereafter, a gate length L is measured. The design value of the gate length L is 0.13 μm.

Then, arsenic is injected vertically into a region where an nMOS transistor is to be formed, at 2 KeV, thus forming SD extension regions of the nMOS transistor. The dose of arsenic has a design value of $5 \times 10^{14}$ atms/cm$^2$. If the measured value of the gate length L is 0.11 μm, then the dose of arsenic may be corrected into $3.5 \times 10^{14}$ atms/cm$^2$, and if the measured value of the gate length L is 0.15 μm, then the dose of arsenic may be corrected into $6.5 \times 10^{14}$ atms/cm$^2$.

Then, boron fluoride (BF$_2$) is further injected rotationally (at about 30° to the vertical direction) at 30 KeV to form pocket regions of the nMOS transistor. The dose of boron fluoride has a design value of $1.0 \times 10^{13}$ atms/cm$^2$. If the measured value of the gate length L is 0.11 μm, then the dose of boron fluoride may be corrected into $1.4 \times 10^{13}$ atms/cm$^2$, and if the measured value of the gate length L is 0.15 μm, then the dose of boron fluoride may be corrected into $0.6 \times 10^{13}$ atms/cm$^2$. Thereafter, the assembly is subjected to the RTA process.

Then, boron fluoride is injected vertically into a region where a pMOS transistor is to be formed, at 2.5 KeV, thus forming SD extension regions of the pMOS transistor. The dose of boron fluoride has a design value of $5 \times 10^{14}$ atms/cm$^2$. If the measured value of the gate length L is 0.11 μm, then the dose of boron fluoride may be corrected into $2.4 \times 10^{14}$ atms/cm$^2$, and if the measured value of the gate length L is 0.15 μm, then the dose of boron fluoride may be corrected into $7.7 \times 10^{14}$ atms/cm$^2$.

Then, arsenic is injected rotationally (at about 30° to the vertical direction) under the condition of 80 KeV to form pocket regions of the pMOS transistor. The dose of arsenic has a design value of $1.3 \times 10^{13}$ atms/cm$^2$. If the measured value of the gate length L is 0.11 μm, then the dose of arsenic may be corrected into $1.8 \times 10^{13}$ atms/cm$^2$, and if the measured value of the gate length L is 0.15 μm, then the dose of arsenic may be corrected into $0.8 \times 10^{13}$ atms/cm$^2$.

Thereafter, side walls are deposited, and boron fluoride is injected to form source/drain regions of the pMOS transistor, and arsenic is injected to form source/drain regions of nMOS transistor. The assembly is then subjected to the RTA process to activate the dopants in the source/drain regions. Thereafter, a cobalt silicide film is deposited on the gate electrode and the source/drain regions, and then an interlayer insulating film is deposited. Thereafter, contact holes are formed in the source/drain regions, and then interconnections are deposited.

In the third Example, the measured value of the gate length L varies from the design value by 20 nm, of which 10 nm is corrected by the dose in the SD extension regions and remaining 10 nm corrected by the dose in the pocket regions. Such variations of the gate length can be corrected by two processes that are linearly superposed as indicated in the third Example.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a semiconductor device having a transistor with SD extension regions and pocket regions, comprising:

measuring a gate length of a gate electrode which is produced by a photolithography and etching process; and adjusting a dose of an impurity to be injected into said pocket regions to bring deviations of the characteristics of the transistor from the design values into a predetermined range, based on the measured value of the gate length and a predetermined formulated relationship between the difference between design and measured values of the gate length of the gate electrode of the transistor and the dose of the impurity to be injected into the pocket regions which is necessary to equalize the characteristics of the transistor to design values.

2. The method of claim 1, further comprising adjusting the energy of the impurity to be injected into said SD extension regions to bring deviations of the characteristics of the transistor from the design values into a predetermined range, based on the measured value of the gate length and the formulated relationship.

3. The method of claim 1, further comprising adjusting a RTA processing temperature to bring deviations of the characteristics of the transistor from the design values into a predetermined range, based on the measured value of the gate length and the formulated relationship.

4. A method of manufacturing a semiconductor device having a transistor with SD extension regions and pocket regions, comprising:

measuring a gate length of a gate electrode which is produced by a photolithography and etching process; and adjusting a dose of an impurity to be injected into said SD extension regions to bring deviations of the characteristics of the transistor from the design values into a predetermined range, based on the measured value of the gate length and a predetermined formulated relationship between the difference between design and measured values of the gate length of the gate electrode of the transistor and the dose of the impurity to be injected into the SD extension regions which is necessary to equalize the characteristics of the transistor to design values.

5. The method of claim 4, further comprising adjusting the energy of the impurity to be injected into said SD extension regions to bring deviations of the characteristics of the transistor from the design values into a predetermined range, based on the measured value of the gate length and the formulated relationship.

6. The method of claim 4, further comprising adjusting a RTA processing temperature to bring deviations of the characteristics of the transistor from the design values into a predetermined range, based on the measured value of the gate length and the formulated relationship.

7. The method of claim 4, wherein said design value of said gate length is about 0.18 μm or less.

8. The method of claim 4, wherein at least one of said characteristics of said transistor comprises the threshold voltage of said transistor.

9. The method of claim 4, wherein at least one of said characteristics of said transistor comprises the ON current of said transistor.

10. The method of claim 4, wherein at least one of said characteristics of said transistor comprises the reliability of said transistor.

11. A method of manufacturing a semiconductor device having a transistor with SD extension regions and pocket regions, comprising:

formulating the relationship between the difference between design and measured values of a gate length of a gate electrode of the transistor and a dose of an impurity to be injected into the SD extension regions which is necessary to equalize characteristics of the transistor to design values;

measuring the gate length of the gate electrode which is produced by a photolithography and etching process; and adjusting the dose of the impurity to be injected into said SD extension regions to bring deviations of the characteristics of the transistor from the design values into a predetermined range, based on the measured value of the gate length and the formulated relationship.

12. A method according to claim 11, further comprising:

bringing an effective channel length of said transistor closely to a design value to adjust the deviations of the characteristics of the transistor from the design values into said predetermined range.

13. A method according to claim 11, wherein said difference between the design and measured values of the gate length falls within a range of ±20% of said design value.

14. The method of claim 11, further comprising adjusting the energy of the impurity to be injected into said SD extension regions to bring deviations of the characteristics of the transistor from the design values into a predetermined range, based on the measured value of the gate length and the formulated relationship.

15. The method of claim 11, further comprising adjusting a Rapid Thermal Anneal (RTA) processing temperature to bring deviations of the characteristics of the transistor from the design values into a predetermined range, based on the measured value of the gate length and the formulated relationship.

16. A method of manufacturing a semiconductor device having a transistor with SD extension regions and pocket regions, comprising:

formulating the relationship between the difference between design and measured values of a gate length of a gate electrode of the transistor and a dose of an impurity to be injected into the pocket regions which is necessary to equalize characteristics of the transistor to design values;

measuring the gate length of the gate electrode which is produced by a photolithography and etching process; and adjusting the dose of the impurity to be injected into said pocket regions to bring deviations of the characteristics of the transistor from the design values into a predetermined range, based on the measured value of the gate length and the formulated relationship.

17. A method according to claim 16, further comprising:

bringing an effective channel length of said transistor closely to a design value to adjust the deviations of the characteristics of the transistor from the design values into said predetermined range.

18. A method according to claim 16, wherein said difference between the design and measured values of the gate length falls within a range of ±20% of said design value.

19. The method of claim 16, further comprising adjusting the energy of the impurity to be injected into said SD extension regions to bring deviations of the characteristics of the transistor from the design values into a predetermined range, based on the measured value of the gate length and the formulated relationship.

20. The method of claim 16, further comprising adjusting a RTA processing temperature to bring deviations of the characteristics of the transistor from the design values into a predetermined range, based on the measured value of the gate length and the formulated relationship.

* * * * *

UNITED STATES PATENT AND TRADEMARK OFFICE
CERTIFICATE OF CORRECTION

Figures 10A, 10B:
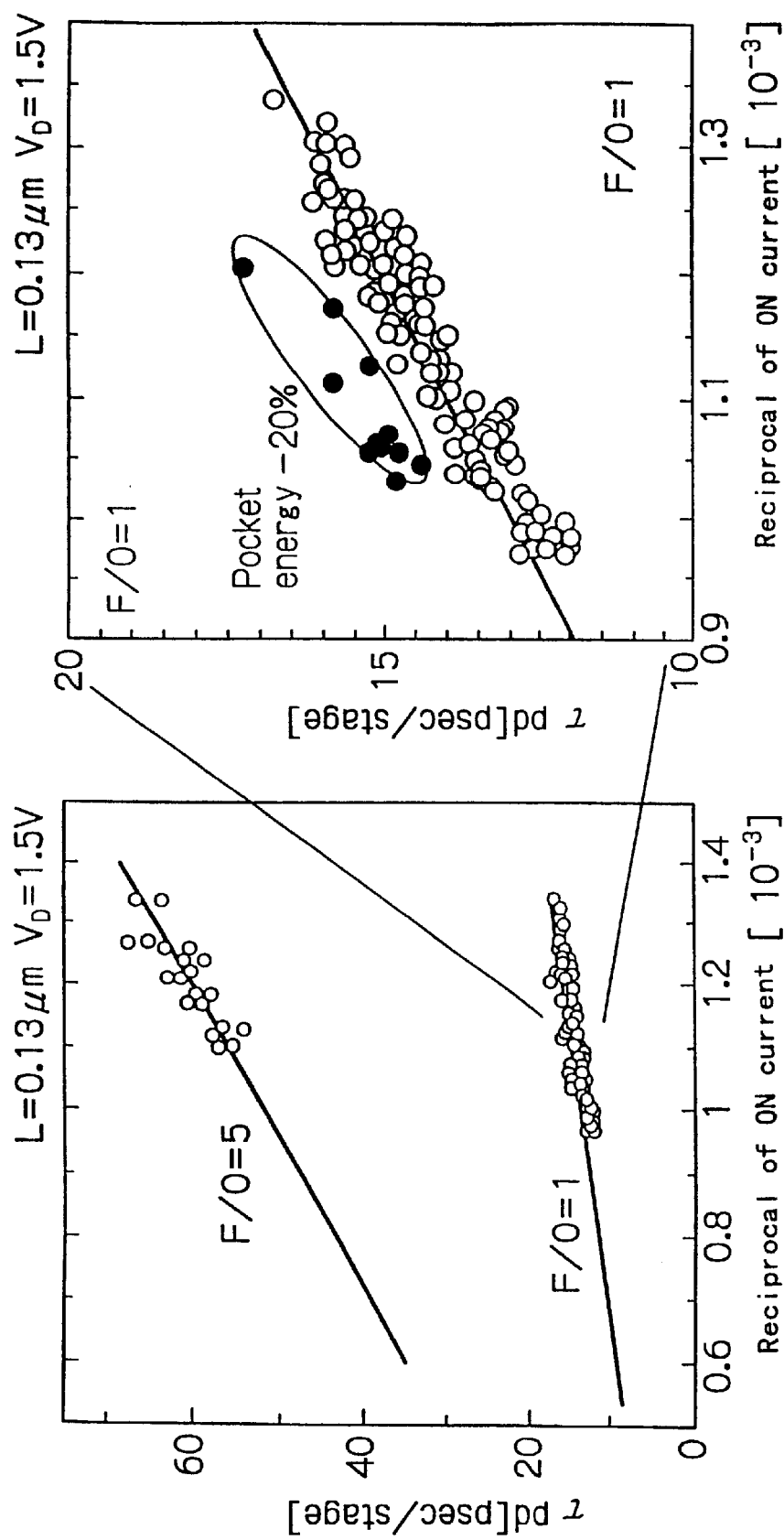
FIG. 10A is a graph showing how a delay time changes when ON currents $I_{on}$ of the transistors of the ring oscillator shown in FIG. 8 are equalized.
FIG. 10B is a magnification of a portion of FIG. 10A.

PATENT NO. : 6,518,075 B2   Page 1 of 1
DATED : February 11, 2003
INVENTOR(S) : Atsuki Ono It is certified that error appears in the above-identified patent and that said Letters Patent is hereby corrected as shown below:

Column 5,
Lines 36-39, should read:
-- FIG. 10A is a graph showing how a delay time changes when ON currents Ion of the transistors of the ring oscillator in FIG. 8 are equalized;
    FIG. 10B is a magnification of a portion of FIG. 10A; --

Column 8,
Lines 6-27 should read:
--      According to the present invention, a ring oscillator shown in FIG. 8 is constructed of nMOS and pMOS transistors whose characteristics have been equalized to design values by changing various process parameters, and the effect on circuit performance is evaluated based on the characteristics of the ring oscillator. FIG. 9 shows a graph of delay times pd of the circuit determined from oscillation frequencies of the ring oscillator at the time the gate length L (measured) of each transistor is equal to and slightly larger than the design value. FIGS.10A and 10B show a graph of delay times pd of the circuit determined from oscillation frequencies of the ring oscillator at the time ON currents of the nMOS and pMOS transistors are equalized by changing the dose in the SD extension regions, the dose in the pocket regions, and the energy with which ions are injected into the pocket regions of transistors whose gate length L deviates from the design value. The bottom capacitance shown in FIGS.11A - 11C is the capacitance between source/drain regions and a semiconductor substrate directly therebeneath, and the side capacitance shown in FIGS.11A - 11C is the capacitance between source/drain regions and a device separating region. --

Signed and Sealed this

Seventeenth Day of August, 2004

JON W. DUDAS
*Acting Director of the United States Patent and Trademark Office*